United States Patent
Wu et al.

(10) Patent No.: US 8,859,380 B2
(45) Date of Patent: Oct. 14, 2014

(54) INTEGRATED CIRCUITS AND MANUFACTURING METHODS THEREOF

(75) Inventors: Zhiqiang Wu, Chubei (TW); Yi-Ming Sheu, Hsinchu (TW); Tsung-Hsing Yu, Hsinchu (TW); Kuan-Lun Cheng, Hsinchu (TW); Chih-Pin Tsao, Zhubei (TW); Wen-Yuan Chen, Yangmei (TW); Chun-Fu Cheng, Changhua (TW); Chih-Ching Wang, Jinhu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 710 days.

(21) Appl. No.: 12/944,104

(22) Filed: Nov. 11, 2010

(65) Prior Publication Data

US 2012/0119298 A1    May 17, 2012

(51) Int. Cl.
*H01L 29/76* (2006.01)
*H01L 21/8234* (2006.01)

(52) U.S. Cl.
CPC *H01L 21/823412* (2013.01); *H01L 21/823425* (2013.01)

USPC .......................................... 438/302; 257/368

(58) Field of Classification Search
CPC ....................... H01L 21/26586; H01L 29/6659
USPC .......................................... 438/302; 257/368
See application file for complete search history.

(56) References Cited

U.S. PATENT DOCUMENTS

| 2003/0022422 A1* | 1/2003 | Torii et al. ..................... 438/183 |
| 2006/0138551 A1* | 6/2006 | Watanabe et al. ............. 257/369 |
| 2008/0119023 A1* | 5/2008 | Lin et al. ....................... 438/279 |

* cited by examiner

*Primary Examiner* — Edward Wojciechowicz
(74) *Attorney, Agent, or Firm* — Lowe Hauptman & Ham, LLP

(57) ABSTRACT

A method of forming an integrated circuit includes forming a plurality of gate structures longitudinally arranged along a first direction over a substrate. A plurality of angle ion implantations are performed to the substrate. Each of the angle ion implantations has a respective implantation angle with respect to a second direction. The second direction is substantially parallel with a surface of the substrate and substantially orthogonal to the first direction. Each of the implantation angles is substantially larger than 0°.

20 Claims, 7 Drawing Sheets

|  | DIBL (mV/V) | Ion (μA/μm) |
|---|---|---|
| Sample 4 | 126 | 757 |
| Sample 5 | 96 | 813 |

FIG. 4A

|  | DIBL (mV/V) | Ion (μA/μm) |
|---|---|---|
| Sample 4 | 132 | 838 |
| Sample 5 | 129 | 920 |

FIG. 4B

INTEGRATED CIRCUITS AND MANUFACTURING METHODS THEREOF

TECHNICAL FIELD

The present disclosure relates generally to the field of semiconductor devices, and more particularly, to integrated circuits and methods of forming the integrated circuits.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

FIG. 4A is a schematic drawing showing a table including experimental data of drain-induce-barrier-lowing (DIBL) effect and on current ($I_{on}$) in accordance with some embodiments.

FIG. 4B is a schematic drawing showing a table including simulation data of drain-induce-barrier-lowing (DIBL) effect and on current ($I_{on}$) in accordance with some embodiments.

DETAILED DESCRIPTION

Figure 1:
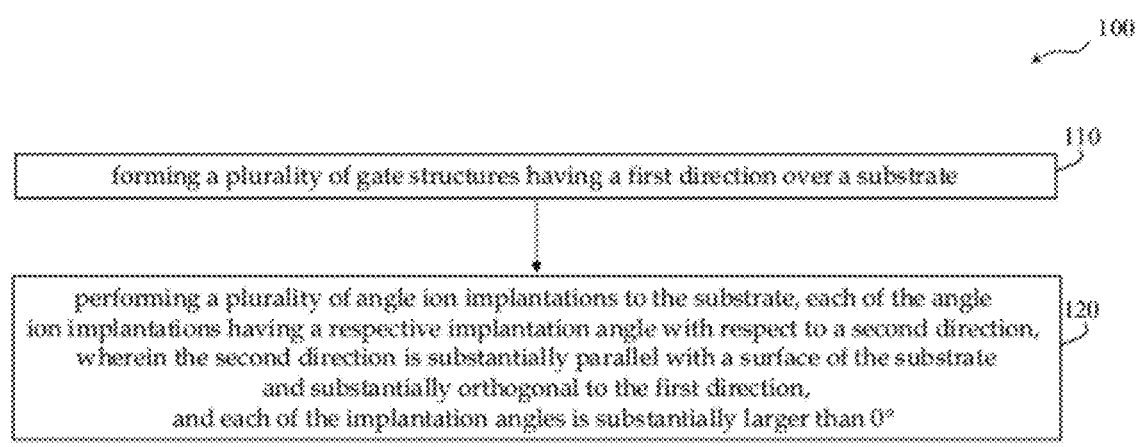
FIG. 1 is a flowchart illustrating an exemplary method of forming an integrated circuit.

Generally, a plurality of ion implantations have been implemented for forming source/drain (S/D) regions, lightly-doped drain (LDD) regions, and pocket regions of transistors. In some examples, the ion implantations each have an implantation direction that is orthogonal to each side edge of gate electrodes. In some other situations, a quadruple ion implantation process is performed on a wafer while it is rotated at 0°, 90°, 180°, and 270°.

It is found that while the integrated circuit is scaled down, the ion implantations for forming the S/D regions, LDD regions, and/or pocket regions may be blocked due to a high aspect ratio of the height of the gate electrode to the space of the gate electrodes. Blocking the ion implantation may subject electrical characteristics of devices on the same wafer to an undesired variation. The substantially uniform electrical characteristics of devices are not achieved.

It is understood that the following descriptions provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a flowchart illustrating an exemplary method of forming an integrated circuit in accordance with some embodiments. In FIG. 1, a method 100 of forming an integrated circuit can include forming a plurality of gate structures longitudinally arranged along a first direction over a substrate (step 110). The method 100 can further include performing a plurality of angle ion implantations to the substrate (step 120). Each of the angle ion implantations can have a respective implantation angle with respect to a second direction. The second direction is substantially parallel with a surface of the substrate and substantially orthogonal to the first direction. Each of the implantation angles can be substantially larger than 0°.

Figure 2A:
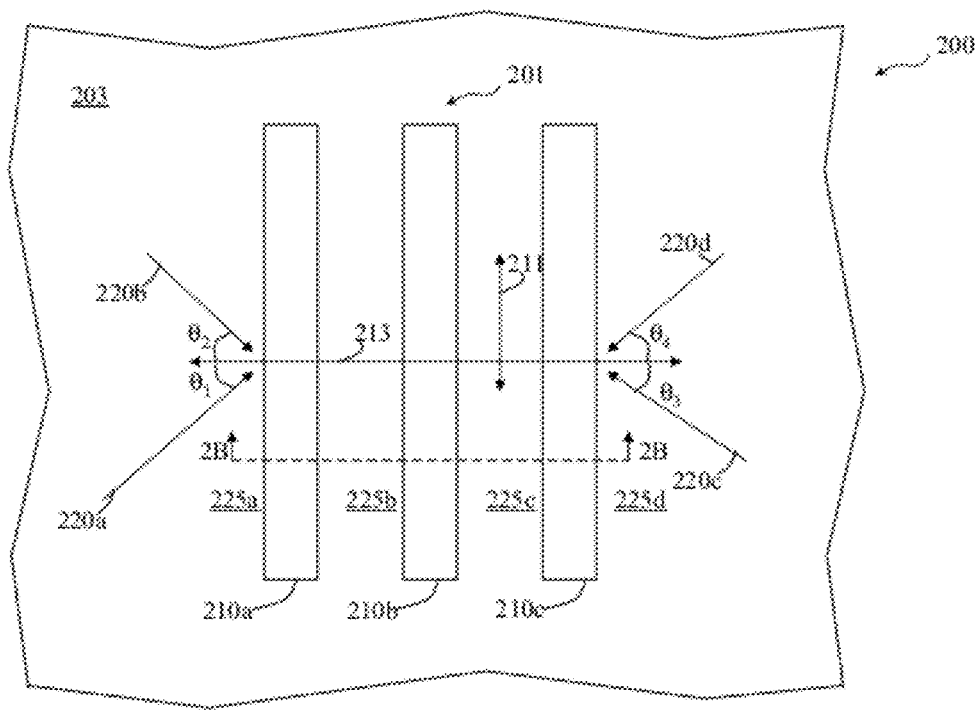
FIG. 2A is a schematic drawing illustrating a top view of an exemplar integrated circuit that is subjected to a plurality of ion implantations.

FIG. 2A is a schematic drawing illustrating a top view of an exemplar integrated circuit that is subjected to a plurality of ion implantations. In FIG. 2A, an integrated circuit 200 can include at least one transistor, e.g., transistor 201. The integrated circuit 200 can be a digital circuit, an analog circuit, a mixed-signal circuit, a static random access memory (SRAM) circuit, an embedded SRAM circuit, dynamic random access memory (DRAM) circuit, an embedded DRAM circuit, a non-volatile memory circuit, e.g., FLASH, EPROM, $E^2$PROME, a field-programmable gate circuit, or any combinations thereof.

Referring to FIG. 2A, the integrated circuit 200 can include a plurality of gate structures, e.g., gate structures 210a-210c, formed over a substrate 203. The gate structures 210a-210c can be routed in a direction 211, e.g., a routing direction. In some embodiments, the substrate 203 may include an elementary semiconductor material, a compound semiconductor material, an alloy semiconductor material, or any other suitable material or combinations thereof. The elementary semiconductor material can include silicon or germanium in crystal, polycrystalline, or an amorphous structure. The compound semiconductor material can include silicon carbide, gallium arsenide, gallium phosphide, indium phosphide, indium arsenide, and/or indium antimonide. The alloy semiconductor material can include SiGe, GaAsP, AlInAs, AlGaAs, GaInAs, GaInP, and/or GaInAsP. In at least one embodiment, the alloy semiconductor substrate may have a gradient SiGe feature in which the Si and Ge composition change from one ratio at one location to another ratio at another location. In another embodiment, the alloy SiGe is formed over a silicon substrate. In yet another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epitaxial layer or a buried layer. In other examples, the compound semiconductor substrate may have a multilayer structure, or the substrate may include a multilayer compound semiconductor structure.

In some embodiments, the gate structures 210a-210c can each be a conductive gate structure, e.g., a polysilicon gate structure, a metal gate structure, a dummy gate structure, or any suitable gate structure. For example, a conductive gate structure can have a stack structure including a gate dielectric layer, a conductive material layer, and/or other suitable layers. A metal gate structure can have a stack structure including a high dielectric constant gate layer, a diffusion barrier layer, a metal work function layer, a metallic layer, and/or other suitable layers. A dummy gate structure can have a stack structure including a dummy material layer, a hard mask layer, and/or other suitable layers.

Referring again to FIG. 2A, a direction 213 can be substantially parallel with a surface of the substrate 203 and substantially orthogonal to the direction 211. The substrate 203 of the integrated circuit 200 can be subjected to a plurality of angle ion implantations, e.g., angle ion implantations 220a-220d. The angle ion implantations 220a-220d can form at least portions of a plurality of doped regions, e.g., doped regions 225a-225d, which are formed in the substrate 203. The doped regions 225a-225d can each be adjacent to at least one sidewall of the gate structures 210a-210c. For example, the doped region 225a is adjacent to the sidewall of the gate structure 210a. The doped region 225b is adjacent to the sidewalls of the gate structures 210a and 210b. The doped region 225c is adjacent to the sidewalls of the gate structures 210b and 210c. The doped region 225d is adjacent to the sidewall of the gate structure 210c. It is noted that the number of the angle ion implantations 220a-220d is merely exemplary. The scope of the present application is not limited thereto.

Referring to FIG. 2A, the angle ion implantations 220a-220d can each have an implantation angles $\theta_1$-$\theta_4$, respectively, with respect to the direction 213. Each of the implantation angles $\theta_1$-$\theta_4$ can be substantially larger than 0°. In some embodiments, the term "substantially larger than 0°" can represent that the implantation angles $\theta_1$-$\theta_4$ each are substantially equal to or larger than 5°. In other embodiments, each of the implantation angles $\theta_1$-$\theta_4$ can be in the range from about 5° to about 40°. In some other embodiments, each of the implantation angles $\theta_1$-$\theta_4$ can be in the range from about 50° to about 85°. In yet still some other embodiments, each of the implantation angles $\theta_1$-$\theta_4$ can be in the range from about 15° to about 40°.

Figure 2B:
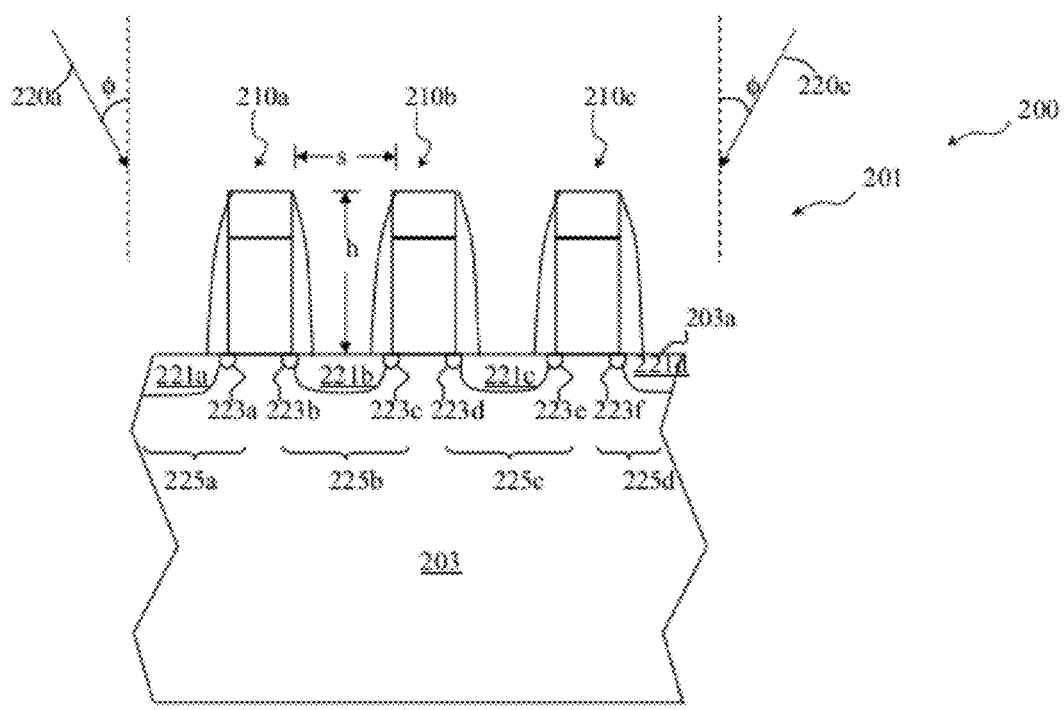
FIG. 2B is a schematic drawing illustrating a cross-sectional view taken along the section line 2B-2B shown in FIG. 2A.

FIG. 2B is a schematic drawing illustrating a cross-sectional view taken along the section line 2B-2B shown in FIG. 2A. In FIG. 2B, the gate structures 210a-210c can be formed over the substrate 203. Spacers (not labeled) can be disposed on sidewalls of the gate structures 210a-210c. The gate structures 210a and 210b can have a space s. Each of the gate structures 210a-210c can have a height h. An aspect ratio of the height to space can be represented as h/s.

In some embodiments, the angle ion implantation 220a-220d can each be tilted with an angle $\phi$ that is tilted from a direction that is substantially orthogonal to the surface 203a of the substrate 203. In some embodiments, a range of the tilt angle $\phi$ can be from about a tan(s/2h) to about a tan(s/h). Due to the use of the implantation angles $\theta_1$-$\theta_4$, the tilt angle $\phi$ can be larger than a tan(s/2h) and the shielding effect resulting from the height of the gate structures 210a-210c can be reduced. In other embodiments, the tilt angle $\phi$ of about a tan(s/2h) or less can still be applied for the angle ion implantations 220a-220d. In some embodiments, around 50% or more of the dosage can be implanted under the gate structures 210a-210c.

The angle ion implantation 220a-220d can be pocket ion implantations, source/drain (S/D) ion implantations, lightly-doped drain (LDD) ion implantations, and/or any ion implantations that are performed in or near to doped regions 225a-225d. In some embodiments, the doped regions 225a can include a S/D doped region 221a and a pocket doped region 223a, the doped regions 225b can include a S/D doped region 221b and pocket doped regions 223b and 223c, the doped regions 225c can include a S/D doped region 221c and pocket doped regions 223d and 223e, and the doped regions 225d can include a S/D doped region 221d and a pocket doped region 223f.

In some embodiments using S/D ion implantations, the S/D doped regions 221a-221d can be formed in the substrate 203. In other embodiments using pocket ion implantations, the pocket doped regions 223a-223f can be formed in the substrate 203 and adjacent to the sidewalls of the gate structures 210a-210c. In some embodiments for forming at least one N-type transistor, the S/D doped regions 221a-221d can have N-type dopants such as Arsenic (As), Phosphorus (P), other group V elements, or any combinations thereof, and the pocket doped regions 223a-223f can have P-type dopants such as Boron (B) and/or other group III elements. In other embodiments for forming at least one P-type transistor, the S/D doped regions 221a-221d can have dopants such as Boron (B) and/or other group III elements, and the pocket doped regions 223a-223f can have N-type dopants such as Arsenic (As), Phosphorus (P), other group V elements, or any combinations thereof.

Figure 3:
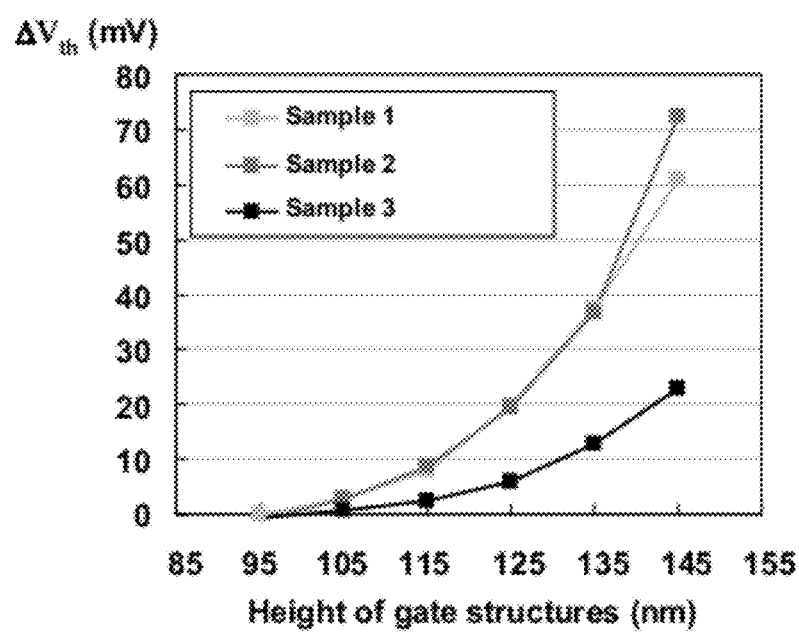
FIG. 3 is a schematic drawing illustrating relations between threshold voltage variations and heights of gate structures in accordance with some embodiments.

FIG. 3 is a schematic drawing illustrating relations between threshold voltage variations and heights of gate structures in accordance with some embodiments. In FIG. 3, the vertical axis represents threshold voltage variations ($\Delta V_{th}$), and the horizontal axis represents heights of gate structures 210a-210c (shown in FIG. 2B). In at least the embodiment depicted in FIGS. 2A/2B, the space between the gate structures 210a and 210b can be fixed around 90 nm. For sample 1, four pocket ion implantations are performed. The ion implantations each have an implantation angle that is orthogonal to a side edge of the gate structure. That is, the ion implantations are performed while the substrate is rotated at 0°, 90°, 180°, and 270°. For sample 2, two pocket ion implantations are performed. One of the two pocket ion implantations is performed on one side edge of the gate structures having a 0-degree implantation angle, and the other one is performed on the opposite side edge of the gate structures having a 0-degree implantation angle. For sample 3, four pocket ion implantations 220a-220d are performed. Each of the implantation angles $\theta_1$-$\theta_4$ is about 30°. In some embodiments, the implantation dosage of each pocket ion implantation of sample 3 is lower than those of the sample 1 and sample 2.

As noted, the space between two neighboring gate structures is fixed. If the height of the gate structures is increased, the aspect ratio (h/s) of the gate structures is also increased. Due to the increase of the aspect ratio, the threshold voltage variation ($\Delta V_{th}$) in each of the samples is increased.

It is also noted that the sample 3 has pocket ion implantations each having the implantation angle that is substantially larger than 0°, e.g., about 30°. It is found that the threshold voltage variation ($\Delta V_{th}$) of the sample 3 is substantially lower than those of the samples 1 and 2. With the lower threshold voltage variation ($\Delta V_{th}$), more uniform electrical characteristics, e.g., driving current, of the transistors can be achieved.

FIG. 4A is a schematic drawing showing a table including experimental data of drain-induce-barrier-lowing (DIBL) effect and on current ($I_{on}$) in accordance with some embodiments. In FIG. 4A, the sample 4 has four pocket ion implantations and the same implantation angles as the sample 1 described above in conjunction with FIG. 3. For sample 5, four pocket ion implantations 220a-220d are performed. Each of the implantation angles $\theta_1$-$\theta_4$ is about 15°. In some embodiments, the implantation dosage of each pocket ion implantation of sample 5 is lower than that of the sample 4. As shown in FIG. 4A, the sample 5 has a lower DIBL effect and a higher on current. The DIBL effect and on current of the sample 5 are better than those of the sample 4.

FIG. 4B is a schematic drawing showing a table including simulation data of drain-induce-barrier-lowing (DIBL) effect and on current ($I_{on}$) in accordance with some embodiments. As shown in FIG. 4B, the simulation results of DIBL effect and on current of the sample 5 are better than those of the sample 4. As shown in FIGS. 4A-4B, the trend of the experimental and simulation data regarding DIBL effect and on current are consistent.

Figure 5:
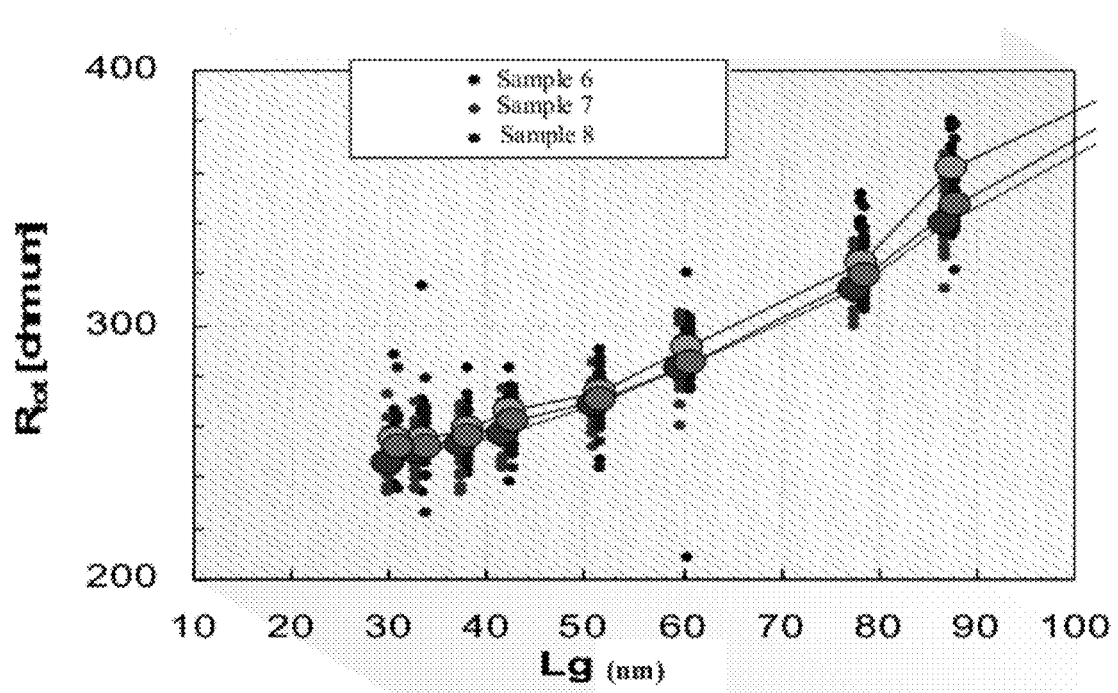
FIG. 5 is a schematic drawing illustrating relations between transistor resistances and gate lengths of transistors in accordance with some embodiments.

FIG. 5 is a schematic drawing illustrating relations between transistor resistances and gate lengths of transistors in accordance with some embodiments. In FIG. 5, the vertical axis represents transistor resistances ($R_{tot}$) while the transistors are turned on and the horizontal axis represents gate lengths ($L_g$) of the transistors. For the sample 6, four pocket ion implantations are performed. The pocket ion implantations can have the same implantation angles as the sample 1 described above in conjunction with FIG. 3. For sample 7, four pocket ion implantations 220a-220d are performed. Each of the implantation angles $\theta_1$-$\theta_4$ is about 30°. For sample 8, four pocket ion implantations 220a-220d are performed. Each of the implantation angles $\theta_1$-$\theta_4$ is about 25°. As shown in FIG. 5, lines of samples 6-8 are connected through average values of the samples at different gate lengths. It is found that the transistor resistances of the samples 7 and 8 are lower than those of the sample 6. In some embodiments, the implantation dosage of each pocket ion implantation of sample 7 or sample 8 is lower than that of the sample 6.

Figure 6:
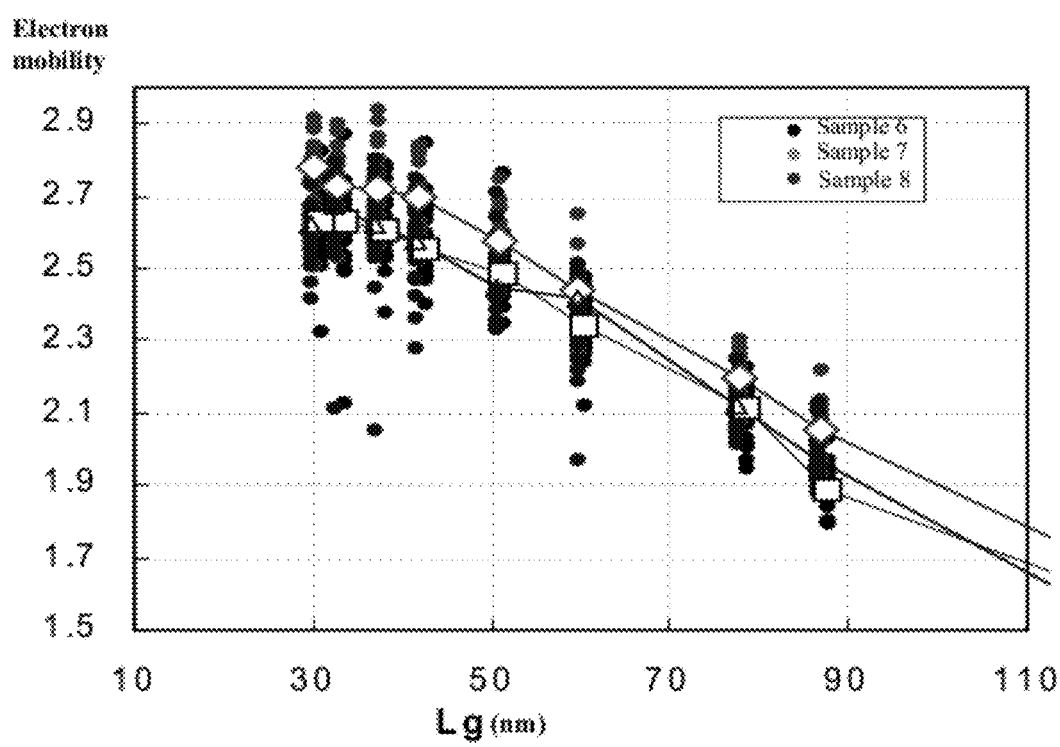
FIG. 6 is a schematic drawing illustrating relations between electron mobility and gate lengths of transistors in accordance with some embodiments.

FIG. 6 is a schematic drawing illustrating relations between electron mobility and gate lengths of transistors. In FIG. 6, the vertical axis represents electron mobility and the horizontal axis represents gate lengths ($L_g$) of the transistors. As shown in FIG. 6, the electron mobility of the samples 7 and 8 are higher than those of the sample 6.

It is noted that the steps of the method 100 described above in conjunction with FIGS. 1 and 2A-2B are merely exemplary. The method 100 can include different steps according to different process flows. For example, the gate structures 210a-210c can be formed by a gate-first process or a gate-last process. In some embodiments using a gate-last process, the method 100 can include a gate replacing process. The gate structures 210a-210c can be dummy gate structures. The dummy gate structures 210a-210c can each include a dummy gate material and a hard mask material formed thereover. The dummy gate material can be made of at least one material such as polysilicon, amorphous silicon, silicon oxide, silicon nitride, or a material having an etching rate that is substantially different from the spacers (shown in FIG. 2B).

For the gate-last process, the hard mask materials and the dummy gate materials can be removed, for example, by a wet etch process, a dry etch process, or any combinations thereof. After removing the dummy gate materials, the method 100 can include forming gate electrode material within openings in which the dummy gate materials are disposed. In some embodiments, the gate electrode material can be a stack structure including a diffusion barrier layer, a metallic work function layer, a metallic conductive layer, and/or other suitable material layers.

In some embodiments, at least one high dielectric constant (high-k) layer (not shown) can be formed under the gate electrode material. The high-k dielectric layer can include high-k dielectric materials such as $HfO_2$, HfSiO, HfSiON, HfTaO, HfSiO, HfZrO, other suitable high-k dielectric materials, or any combinations thereof. In some embodiments, the high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, or any combinations thereof.

In some embodiments, the diffusion barrier can be configured to prevent metallic ions of the work function metal material from diffusing into the gate dielectric material. The diffusion barrier may comprise at least one material such as aluminum oxide, aluminum, aluminum nitride, titanium, titanium nitride (TiN), tantalum, tantalum nitride, other suitable material, and/or combinations thereof.

In some embodiments, the metallic work function layer can include at least one P-metal work function layer and/or at least one N-metal work function layer. The P-type work function materials can include compositions such as ruthenium, palladium, platinum, cobalt, nickel, and conductive metal oxides, and/or other suitable materials. The N-type metal materials can include compositions such as hafnium, zirconium, titanium, tantalum, aluminum, metal carbides (e.g., hafnium carbide, zirconium carbide, titanium carbide, aluminum carbide), aluminides, and/or other suitable materials. In some embodiments, the metallic conductive layer can be made of at least one material, such as aluminum, copper, Ti, TiN, TaN, Ta, TaC, TaSiN, W, WN, MoN, MoON, $RuO_2$, and/or other suitable materials.

In some embodiments, dielectric materials, contact plugs, via plugs, metallic regions, and/or metallic lines (not shown) can be formed over the gate electrode portions 210a-210c for interconnection. The dielectric layers may include materials such as silicon oxide, silicon nitride, silicon oxynitride, low-k dielectric material, ultra low-k dielectric material, or any combinations thereof. The via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The via plugs, metallic regions, and/or metallic lines can be formed by any suitable processes, such as deposition, photolithography, and etching processes, and/or combinations thereof.

In an exemplary embodiment, a method of forming an integrated circuit includes forming a plurality of gate structures longitudinally arranged along a first direction over a substrate. A plurality of angle ion implantations are performed to the substrate. Each of the angle ion implantations has a respective implantation angle with respect to a second direction. The second direction is substantially parallel with a surface of the substrate and substantially orthogonal to the first direction. Each of the implantation angles is substantially larger than 0°.

In another exemplary embodiment, an integrated circuit includes a plurality of gate structures longitudinally arranged along a first direction over a substrate. A space (s) is between two neighboring gate structures, and the gate structures each have a height (h). A plurality of doped regions each are adjacent to at least one sidewall of the gate structures. The doped regions are formed by a plurality of angle ion implantations. Each of the angle ion implantations has a respective implantation angle with respect to a second direction. The second direction is substantially parallel with a surface of the substrate and substantially orthogonal to the first direction. Each of the implantation angles is substantially larger than 0°.

The foregoing outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
    forming a plurality of gate structures longitudinally arranged along a first direction over a substrate, the gate structures of the plurality of gate structures having a first side and a second side opposite the first side, the first side and the second side being parallel to the first direction; and
    discretely performing a plurality of angle ion implantations to the substrate, a first angle ion implantation of the plurality of angle ion implantations being performed only on the first side of at least one gate structure of the plurality of gate structures, and a second angle ion implantation of the plurality of angle ion implantations being performed only on the second side of the at least one gate structure of the plurality of gate structures,
    wherein each angle ion implantation of the plurality of angle ion implantations has a respective implantation angle with respect to a second direction, the second direction is substantially parallel with a surface of the substrate and substantially orthogonal to the first direction, and each of the implantation angles is substantially larger than 0° and less than 90°.

2. The method of claim 1, wherein the angle ion implantations include at least one of a pocket ion implantation, a source/drain (S/D) ion implantation, or a lightly-doped drain (LDD) ion implantation.

3. The method of claim 2, wherein the angle ion implantations are pocket ion implantations and have the same implantation angle and the implantation angle ranges from about 5° to about 40°.

4. The method of claim 2, wherein the angle ion implantations are pocket ion implantations and have the same implantation angle and the implantation angle ranges from about 50° to about 85°.

5. The method of claim 2, wherein the angle ion implantations are pocket ion implantations and have the same implantation angle and the implantation angle ranges from about 15° to about 40°.

6. The method of claim 2, wherein the angle ion implantations each have an implantation dosage that is lower than an implantation dosage of an ion implantation that has an implantation direction that is orthogonal to a side edge of one gate structure of the plurality of gate structures.

7. The method of claim 1, wherein a space (s) is between two neighboring gate structures, and the gate structures each have a height (h), the angle ion implantations each have a tilt angle that is tilted from a direction that is substantially orthogonal to the surface of the substrate, and the tilt angle ranges from about a tan(s/2h) to about a tan(s/h).

8. A method of forming at least one transistor, the method comprising:
    forming a plurality of dummy gate structures longitudinally arranged along a first direction over a substrate, the dummy gate structures of the plurality of dummy gate structures having a first side and a second side opposite the first side, the first side and the second side being parallel to the first direction, wherein a space (s) is between two neighboring dummy gate structures, and the dummy gate structures each have a height (h); and
    discretely performing a plurality of pocket ion implantations to the substrate, a first pocket ion implantation of the plurality of pocket ion implantations being performed only on the first side of at least one dummy gate structure of the plurality of gate structures, and a second pocket ion implantation of the plurality of pocket ion implantations being performed only on the second side of the at least one dummy gate structure of the plurality of dummy gate structures,
    wherein each pocket ion implantation of the plurality of pocket ion implantations has a respective implantation angle with respect to a second direction, the second direction is substantially parallel with a surface of the substrate and substantially orthogonal to the first direction, and each of the implantation angles is substantially larger than 0° and less than 90°.

9. The method of claim 8, wherein the pocket ion implantations have the same implantation angle and the implantation angle ranges from about 5° to about 40°.

10. The method of claim 8, wherein the pocket ion implantations and have the same implantation angle and the implantation angle ranges from about 50° to about 85°.

11. The method of claim 8, wherein the pocket ion implantations and have the same implantation angle and the implantation angle ranges from about 15° to about 40°.

12. The method of claim 8, wherein the pocket ion implantations each have an implantation dosage that is lower than an implantation dosage of an ion implantation that has an implantation direction that is orthogonal to a side edge of one gate structure of the plurality of gate structures.

13. The method of claim 8, wherein the pocket ion implantations each have a tilt angle that is tilted from a direction that is substantially orthogonal to the surface of the substrate, and the tilt angle ranges from about a tan(s/2h) to about a tan(s/h).

14. A method of forming an integrated circuit, the method comprising:

forming a plurality of first structures over a substrate, the plurality of first structures being arranged in parallel along a first direction, and adjacent two of the plurality of first structures being separated by a space (s), the first structures of the plurality of first structures having a first side and a second side opposite the first side, the first side and the second side being parallel to the first direction; and discretely performing a plurality of angle ion implantations to the substrate, a first angle ion implantation of the plurality of angle ion implantations being performed only on the first side of at least one first structure of the plurality of first structures, and a second angle ion implantation of the plurality of angle ion implantations being performed only on the second side of the at least one first structure of the plurality of first structures, wherein each ion implantation of the plurality of angle ion implantations has a respective implantation angle with respect to a second direction, the second direction is substantially parallel with a surface of the substrate and substantially orthogonal to the first direction, the implantation angle is no less than 5° and no greater than 85°; and the respective implantation direction and a third direction have a tilt angle, the third direction is substantially orthogonal to the first and second directions, and the tilt angle is greater than 0° and less than 90°.

15. The method of claim 14, wherein the first ion implantation includes at least one of a pocket ion implantation, a source/drain (S/D) ion implantation, or a lightly-doped drain (LDD) ion implantation.

16. The method of claim 15, wherein the first ion implantation is a pocket ion implantation, and the implantation angle ranges from about 5° to about 40°.

17. The method of claim 15, wherein the first ion implantation is a pocket ion implantation, and the implantation angle ranges from about 50° to about 85°.

18. The method of claim 15, wherein the first ion implantation is a pocket ion implantation, and the implantation angle ranges from about 15° to about 40°.

19. The method of claim 14, wherein each of the plurality of the first structures has a height (h), and the tilt angle ranges from about a tan(s/2h) to about a tan(s/h).

20. The method of claim 14, wherein the plurality of first structures comprise dummy gate structures having dummy gate materials and spacers disposed on sidewalls of the dummy gate structures, the method further comprising:

removing the dummy gate materials of the plurality of first structures to form a plurality of openings within the spacers; and filing the plurality of openings with one or more conductive materials to form a plurality of second structures over the substrate, wherein the second structures of the plurality of second structures are gate structures.

* * * * *